(12) United States Patent
Jeffryes

(10) Patent No.: US 7,770,645 B2
(45) Date of Patent: Aug. 10, 2010

(54) METHOD AND APPARATUS FOR DOWNHOLE THERMOELECTRIC POWER GENERATION

(75) Inventor: Benjamin Peter Jeffryes, Histon (GB)

(73) Assignee: Schlumberger Technology Corporation, Cambridge, MA (US)

( * ) Notice: Subject to any disclaimer, the term of this patent is extended or adjusted under 35 U.S.C. 154(b) by 305 days.

(21) Appl. No.: 11/612,267

(22) Filed: Dec. 18, 2006

(65) Prior Publication Data

US 2007/0151591 A1 Jul. 5, 2007

(30) Foreign Application Priority Data

Dec. 30, 2005 (GB) .................... 0526556.6

(51) Int. Cl.
 *E21B 36/00* (2006.01)
(52) U.S. Cl. .......................................... 166/302; 166/57
(58) Field of Classification Search ................. 166/65.1, 166/57, 302; 136/205
 See application file for complete search history.

(56) References Cited

U.S. PATENT DOCUMENTS

| 3,709,739 A | 1/1973 | Webb |
| 3,723,189 A * | 3/1973 | Zahn ........................... 136/205 |
| 4,047,093 A * | 9/1977 | Levoy .......................... 322/2 R |
| 5,587,707 A * | 12/1996 | Dickie et al. ........... 340/870.09 |
| 5,929,327 A | 7/1999 | Hafele |
| 5,929,372 A | 7/1999 | Oudoire et al. |
| 6,150,601 A | 11/2000 | Schnatzmeyer et al. |
| 6,380,476 B1 | 4/2002 | Heijnen et al. |
| 2005/0067005 A1* | 3/2005 | Van Der Spek ............. 136/205 |
| 2006/0213669 A1* | 9/2006 | Shipley et al. ............... 166/381 |

FOREIGN PATENT DOCUMENTS

| GB | 1 255 628 | 12/1971 |
| GB | 2 140 206 A | 11/1984 |
| GB | 2 320 733 A | 7/1998 |
| GB | 2 336 943 A | 11/1999 |
| GB | 2 409 473 A | 6/2005 |
| WO | 01/40621 A1 | 6/2001 |
| WO | 03/046333 A3 | 6/2003 |

* cited by examiner

*Primary Examiner*—William P Neuder
*Assistant Examiner*—Cathleen R Hutchins
(74) *Attorney, Agent, or Firm*—James McAleenan; Vincent Loccisano; Brigid Laffey

(57) ABSTRACT

Methods and system are described for providing electric power in a wellbore including at least one thermoelectric generator at a downhole location; and one or more thermally insulated sections of wellbore tubing located such as to reduce heat loss of fluid flowing through the wellbore from the entry point of the fluid to the location of the generator.

22 Claims, 7 Drawing Sheets

METHOD AND APPARATUS FOR DOWNHOLE THERMOELECTRIC POWER GENERATION

The present invention generally relates to an apparatus and a method for generating electrical power inside a wellbore with improved efficiency.

CROSS-REFERENCE TO RELATED APPLICATION

This application claims the benefits of priority from Application Number 0526556.6, entitled "DOWNHOLE THERMOELECTRIC POWER GENERATION," filed in the United Kingdom on Dec. 30, 2005, which is commonly assigned to assignee of the present invention and hereby incorporated by reference in its entirety.

BACKGROUND OF THE INVENTION

In the oil and gas producing industry there is a long-established need for generation electrical power inside a wellbore, particularly a wellbore in the state of producing hydrocarbon fluids.

Whilst many possible solutions to the problem have been suggested, the industry is presently using battery packs and cable connection to the surface.

Among the technical solutions unsuccessfully proposed is the use of thermocouples integrated in or attached to the wall of tubes in the wellbore.

For example, in the U.S. Pat. No. 6,150,601 there is described a method and apparatus for generating electrical power downhole by applying a temperature gradient across a at least two thermocouples. In the U.S. Pat. No. 6,380,476 a thermocouple is placed inside a side-pocket mandrel and brought into contact either to the inner wall of the casing of a wellbore or the formation. In the U.S. Pat. No. 5,929,372 which relates to underwater pipe and not to a wellbore there is suggested to use a stack of high-temperature bismuth telluride thermocouples heated by the wellbore fluid from within and seawater from the outside to maintain a sufficient temperature gradient across the thermocouples.

In the light of the know state of the art, it is clear that an applicable thermoelectric generator requires for further improvements to be operable at a downhole location. It is therefore seen as an object of the present invention to provide an apparatus and method for generate electrical power using the thermo-electrical effect with increased efficiency.

SUMMARY OF THE INVENTION

In accordance with an aspect of the invention, there are provided methods and systems for generating electric power in a wellbore, said system including at least one thermoelectric generator at a downhole location; and one or more thermally insulated sections of wellbore tubing located such as to reduce heat loss of fluid flowing through the wellbore from the entry point of the fluid to the location of the generator.

The wellbore tubing is preferably production tubing or casing tubing.

The one or more thermo-insulated sections are characterized by having a lower heat conductivity coefficient than other sections of the wellbore tubing. Compared to conventional steel pipes as used in the oilfield the one or more thermally insulated sections are characterized by having a by a factor of at least 100 lower heat conductivity coefficient. This preferred embodiment is based on the assumption that it is more economical to reduce the heat conductivity only locally, but as a matter of course the benefits of the present invention may also be reaped by providing a complete string of wellbore tubing with such superior insulation.

The one or more thermo-insulated sections are preferable clad with a layer or layers of thermally insulating material. In a more preferred embodiment double-walled tubing is used with a vacuum or gas filled inner space.

The effect of the present invention can be increased by making the generator a preferred location of heat exchange between the fluid and the surrounding. In a preferred embodiment the generator is located within a thermally insulated section of wellbore tubing.

The generator is preferably of a type exploiting the Seebeck effect. It may include Bismuth-Telluride or even microstructured Bismuth-Telluride/Antimony Telluride.

These and other aspects of the invention will be apparent from the following detailed description of non-limitative examples and drawings.

DETAILED DESCRIPTION

Downhole thermoelectric generators use thermoelectric materials to convert a subsurface heat flux into electrical power. Thermoelectric materials generate a voltage in response to an applied temperature differential, and when in used in series with an electrical load, current and hence power, are generated. When no current is drawn, the thermoelectric materials normally used for generation create a voltage that is proportional to the temperature differential, the coefficient of proportionality being the Seebeck coefficient $$V_0 = S \Delta T \qquad [1]$$

When a current is drawn, the voltage drops according to $$V = V_0 - IR_0 \qquad [2]$$

where $R_0$ is the internal resistance of the thermoelectric generator.

If, for instance, the generator is connected to a resistive load $R_L$, then $V = IR_L$ and hence $$V = \frac{S \Delta T R_L}{R_0 + R_L}. \qquad [3]$$

The power generated is VI, and hence is quadratic in the temperature difference.

From the above analysis it may be seen that maximizing the temperature difference across the thermoelectric elements is crucially important in thermoelectric generator design.

Figure 1:
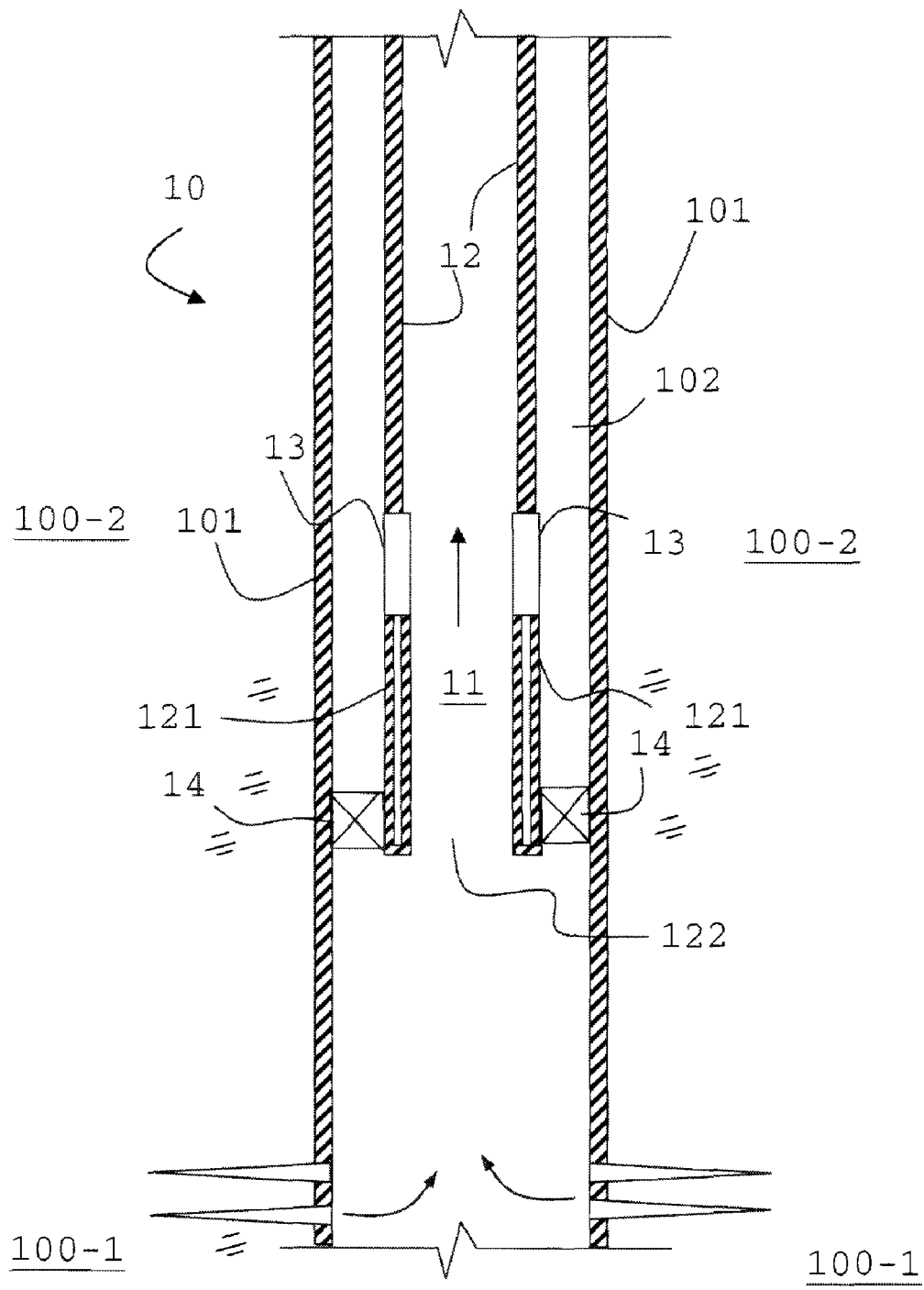
FIG. 1 illustrates basic elements of a downhole electric power system in accordance with an example of the invention.

In accordance with an example of the present invention as illustrated schematically in FIG. 1, it is therefore proposed to provide a thermally insulated zone 121 between the fluid 11 flowing through the wellbore 10 upstream of the location of a thermoelectric generator 13.

In the example of FIG. 1, the thermoelectric generator 13 is mounted on production tube 12. At the bottom of the production tubing 12 there is placed a packer 14 preventing the entry of the produced fluid into the annulus 102 between production tubing 12 and a casing tube 101. Between the entry point 122 of the fluid flow into the production tube 12 and the mounting point of the thermoelectric generator 13 there is zone 121 of well tube that is specifically adapted to provide increased thermal insulation when compared to conventional wellbore tubing. Produced hydrocarbons enter the production tubing at a temperature either equal to that of the surrounding rock 100-1, or higher. As the fluid move up the production tubing, it will be hotter than the surrounding annulus, which is cooled by the surrounding rock 100-2 at the local geothermal temperature. This temperature difference generally increases as the fluid passed through tubing higher in the wellbore.

Figure 2A:
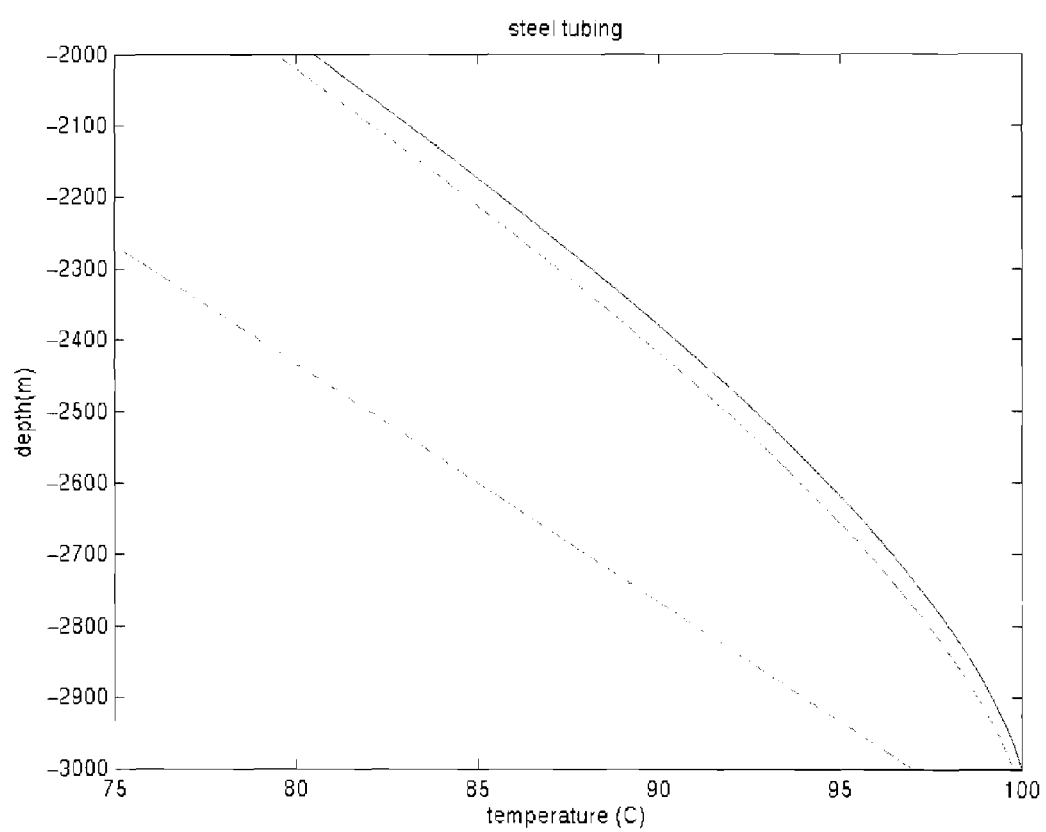
FIGS. 2A-C illustrate the effect of the present invention.

An example of this effect is shown in FIG. 2A, based on a theoretical calculation. The solid line shows the temperature of the fluid in the production tubing, entering the tubing at 100 C, at a depth of 3000 m. The geothermal gradient is the dash-dotted line, and the dashed line shows the calculated temperature in the annulus. In the example, the fluid entering the production tubing is 3 C above the geothermal temperature at that depth.

In order to maximize the temperature difference, the flowing fluid should be kept as close to its initial temperature as possible, and heat flow to the annulus minimized. Both effects can be achieved by using tubing that is more insulating than steel upstream of the thermoelectric generator.

Suitable methods for insulating the tubing are either cladding the tubing in a thermal insulator that is not affected by the well temperature or mechanical environment—for instance fibrefrax products available from Unifrax, or employing dual-tubing with an insulating gap, for instance vacuum insulated tubing (VIT) available from Grant-Prideco division Tube-Alloy.

Figure 2B:
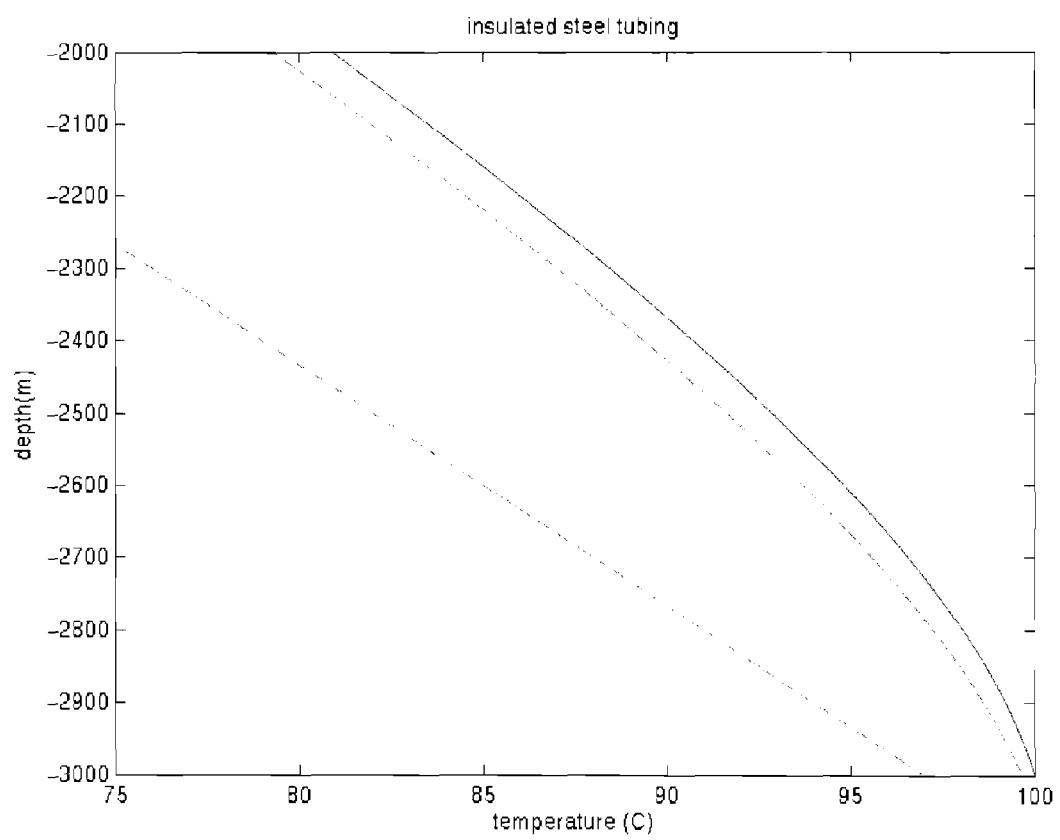

In FIG. 2B, the calculation has been repeated with the conductivity of the tubing reduced by a factor of 100, corresponding to surrounding the tubing with some form of fibrous or ceramic insulation. The temperature of the flowing oil is not greatly affected, but there is a noticeably greater temperature difference with the annulus.

Figure 2C:
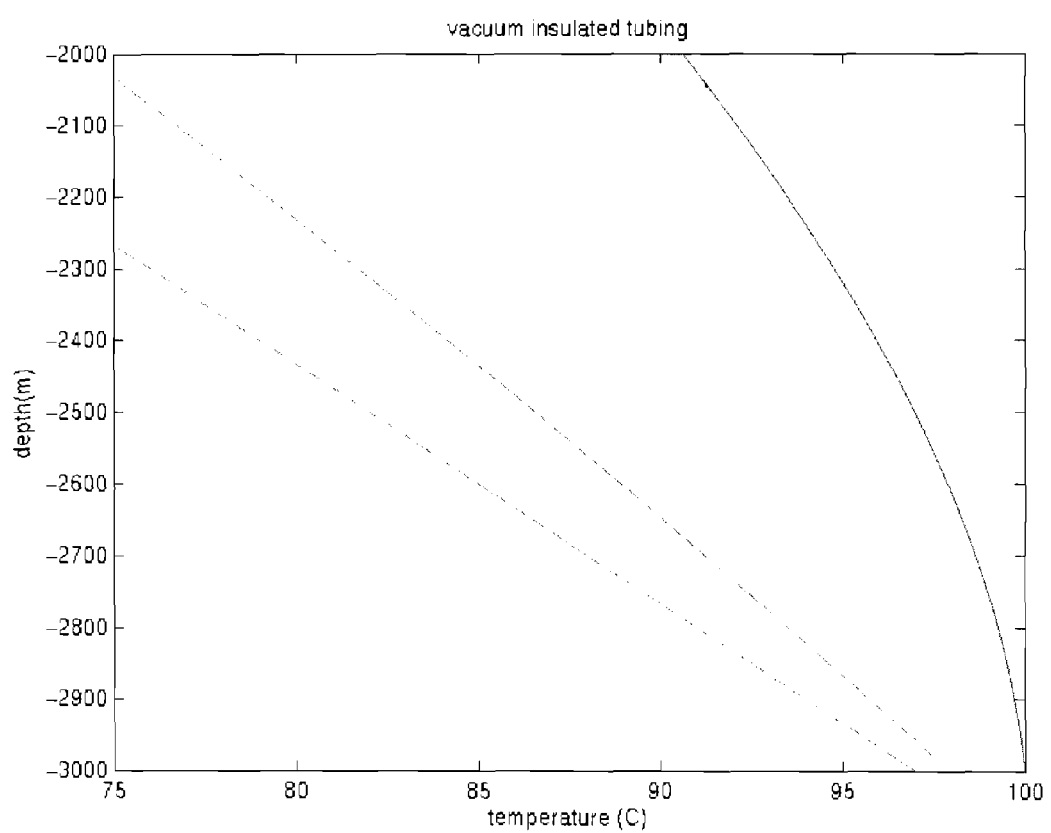

In FIG. 2C, the conductivity of the tubing has been reduced by a further factor of 80, corresponding to vacuum insulated tubing with insulated joints. In this example the flowing oil looses far less heat, and the temperature difference to the annulus is significantly larger.

Figure 3:
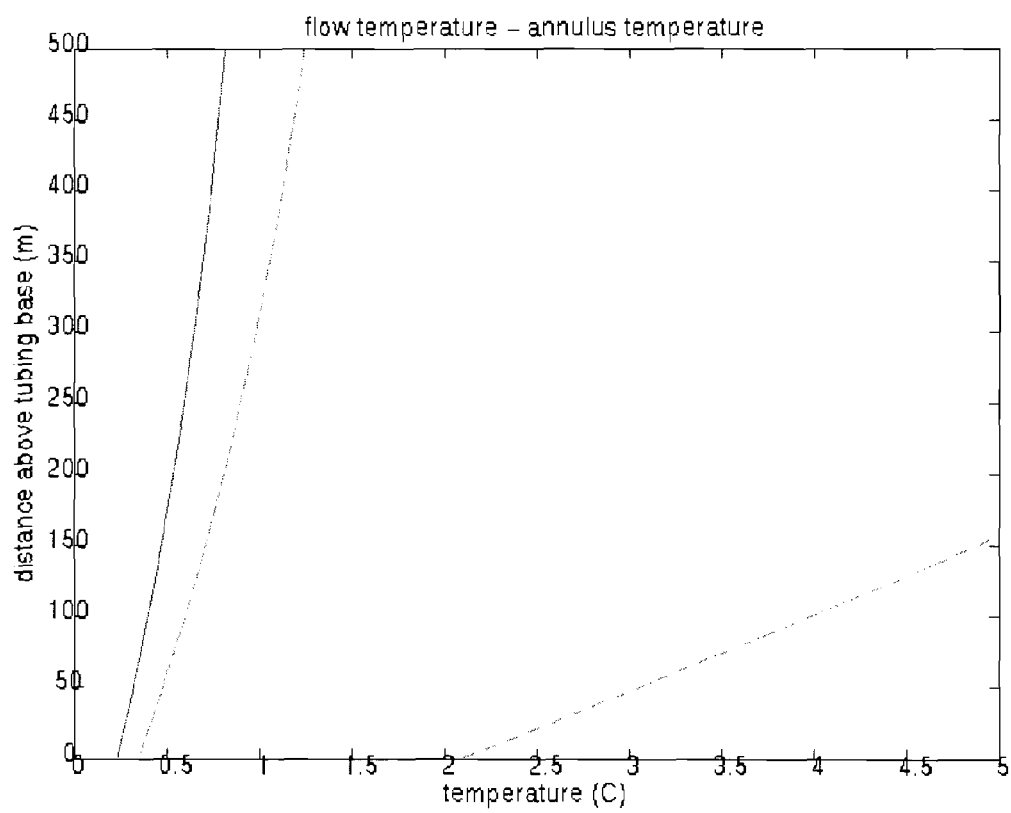
FIG. 3 illustrates the increased efficiency of the present invention.

The absolute temperature difference between the flowing fluid and the annulus for steel tubing (solid line), insulated tubing (dashed line) and vacuum insulated tubing (dash-dot line) versus distance from the bottom of the production tubing is shown in FIG. 3. It can be seen that for instance at 100 m above the entry point of production tubing, there is less than 0.5 C temperature difference between the flowing fluid and the annulus with steel tubing, whereas with vacuum insulated tubing a difference or temperature gradient of around 4 C is available.

These calculations are only intended to be representative, and for any particular well geometry, flow rates and fluid compositions, the particular results will vary.

It should be noted that all the arguments detailed above for a thermoelectric generator mounted on production tubing also apply for a thermoelectric generator mounted on fluid injection tubing designed to carry fluid from the surface, except the sign of the heat difference is reversed, and the preferred location for insulation changing to being above the thermoelectric generator and not below it as shown in FIG. 1.

For a particular location of thermoelectric generator, to maximize the electric output, the heat flux through the generator must be maximized. This is a particular concern in an environment such as downhole, where the material between the heat source (produced hydrocarbons) and the heat sink (the annulus, or the surrounding formation) is thermally conductive. Most thermoelectric materials with a high Seebeck coefficient S are also poor thermal conductors, and thus, for instance, mounting a thermoelectric generator by itself on the outside of production tubing will result in a very small temperature gradient across the generator, even if the outer surface of the generator matches the annular temperature. Because of the thermal conductivity contrast between the metal and the thermocouples, most of the temperature gradient will be within the tubing itself, and only a very small portion within the thermocouples.

A further advantage of providing an insulating environment for the generator is that if the flow of produced fluid is interrupted, the time taken for the local heat to dissipate will increase, and thus the generator will continue to provide power for longer before the local temperature gradient is too low.

A suitable technology for borehole thermoelectric generators is Bismuth-Telluride, which is a semiconductor and can be doped to be either P type or N type. Many companies make thermoelectric modules from this material, for instance Hi-Z of San Diego, Calif. More recently microstructured materials have been created with improved thermoelectric characteristics, for instance the superlattice Bismuth-Telluride/Antimony Telluride structures created by RTI International and Nextreme thermal solutions of North Carolina.

In order to maximize the heat difference actually across the thermoelectric generator, the area surrounding the generator should be sufficiently thermally insulated, so that instead of heat preferentially being conducted around the generator, it is preferentially conducted through the generator. The thermal path that leads through the generator should be as thermally conductive as possible, and in as good thermal contact with the heat sink as possible, so that for instance a high conductivity radiator element, made out of Aluminum for example may be employed on the heat sink side of the generator.

Figure 4:
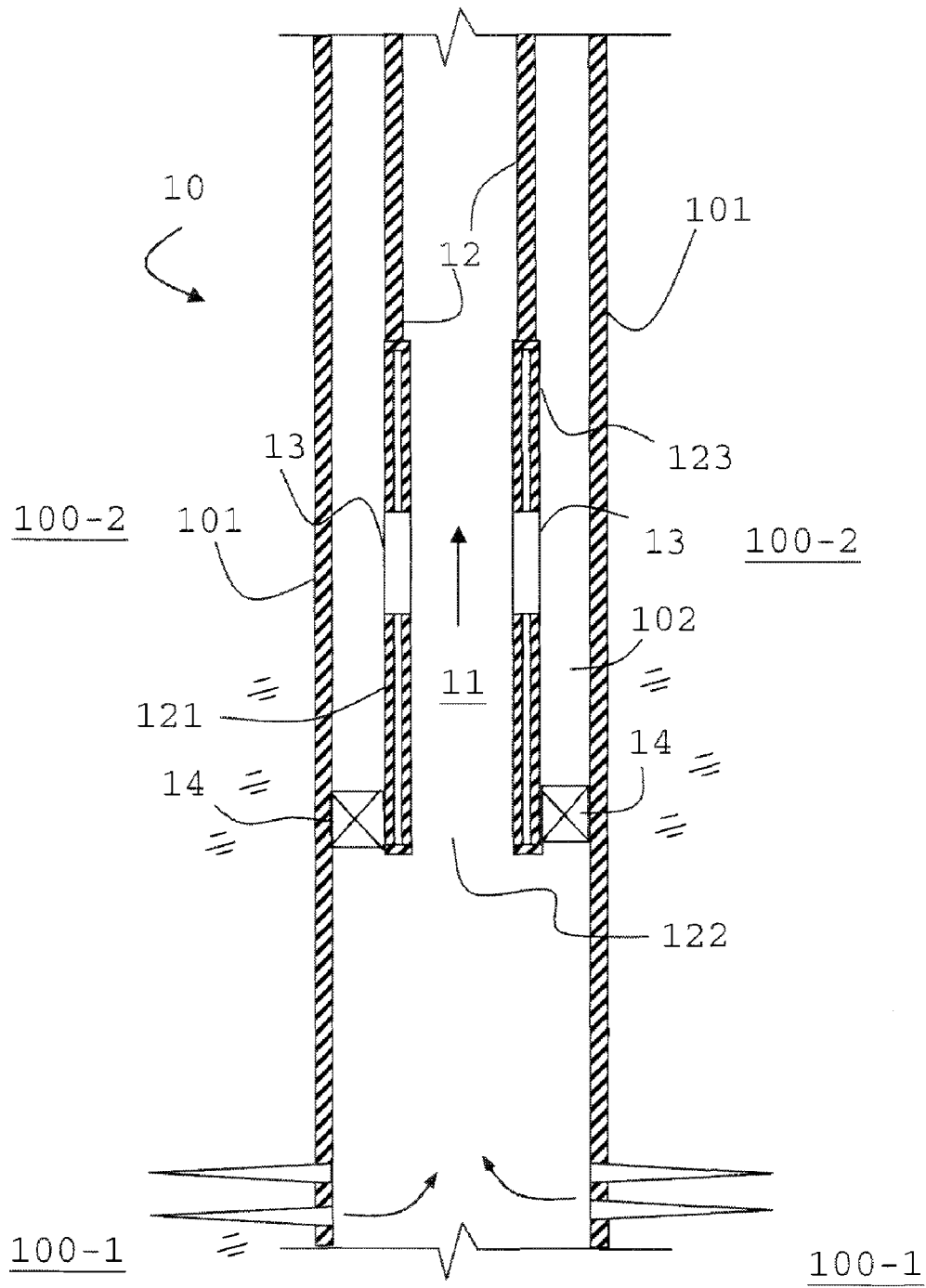
FIG. 4 is a variant of the system of FIG. 1.

The example of FIG. 4 illustrates an improved variant of the example of FIG. 1.

The apparatus shown includes all elements of FIG. 1 denoted by the same numerals. However in accordance with the observations described above the apparatus shown is adapted to optimize the heat flow through the generator 13 itself. Hence, there is additional insulated tubing 123 shown above the thermoelectric generator 13 before the tubing reverts to standard production tubing 12. As a consequence of this modification, a greater temperature difference can be maintained at the location of the generator 13.

Following the above description, it will be appreciated that the insulated tubing need not be deployed all the way from the thermoelectric generator down to the bottom of the production tubing, however the larger heat-flux into the annulus below the insulated casing could increase the inverted heat gradient in the annulus, which could then cause increased convection currents—reducing the effectiveness of the insulated casing higher up.

Insulated casing can also be deployed below the bottom of the production tubing, in order to both maintain fluid temperature and reduce the heat flow to the rock, however an economic solution may restrict the deployment of insulated tubing along extended stretches of the wellbore.

Figure 5:
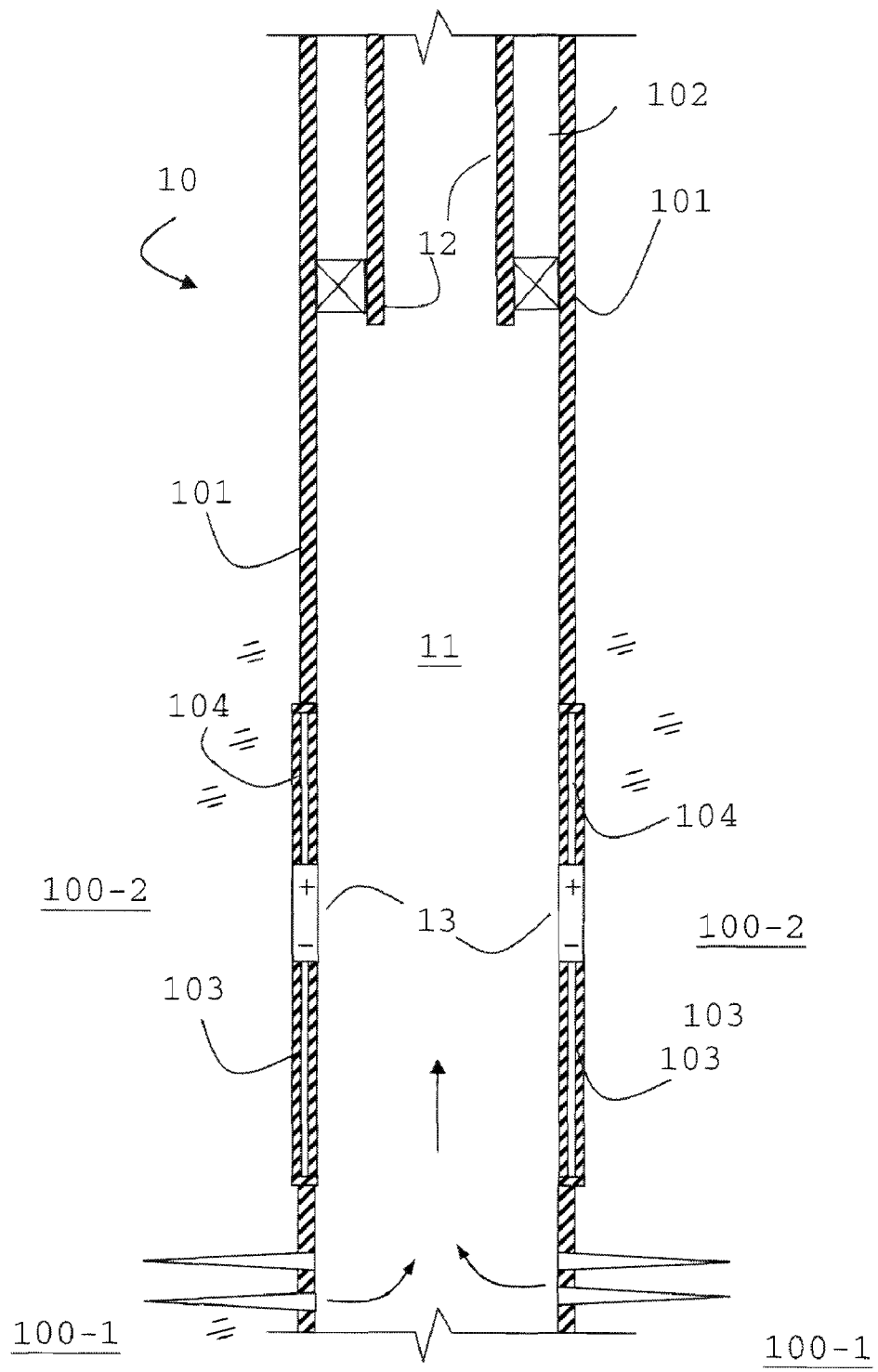
FIG. 5 is a further embodiment of the invention used with casing tubing.

In another apparatus for combining a thermoelectric generator and insulated tubing shown in FIG. 5, the thermoelectric generator 13 may be mounted on the wellbore casing 101 below the bottom of the production tubing 12 and cemented into the well 10. The temperature difference between production layer 100-1 and the layer 100-2 at the location of the generator 13 will be reduced compared to a generator employed higher up, and thus maximizing the heat flow is even more important. In this deployment, a length 103 of casing upstream of the generator 13 and preferably also a length 104 of casing downstream of the generator 13 will be highly insulating, either clad in insulating material or through the use of double walled casing employing vacuum insulation.

The invention claimed is:

1. A system for providing electric power in a wellbore comprising tubing which defines a flowpath for conveyance of hydrocarbon fluid with an entry point for hydrocarbon fluid to flow into the well bore from subterranean rock, said system comprising:
   at least one thermoelectric generator at a downhole location, to generate electricity from heat flowing between the fluid passing the thermoelectric generator and a region surrounding said location; and
   one or more thermally insulated sections of wellbore tubing, entirely located downhole, having a lower heat conductivity than another section of wellbore tubing extending downstream from said one or more thermally insulated sections, where one or more of said thermally insulated sections of wellbore tubing is located upstream of the generator such as to reduce heat loss of fluid flowing through the wellbore from the entry point of said fluid to the location of the generator and thereby increase a temperature difference across the thermoelectric generator between the fluid passing the generator and the surrounding geothermal temperature.

2. The system of claim 1 wherein the wellbore tubing is production tubing.

3. The system of claim 1 wherein the wellbore tubing is casing tubing.

4. The system of claim 1 wherein the one or more thermally insulated sections are characterized by having a heat conductivity coefficient which is lower by a factor of at least 100 than conventional wellbore tubing steel.

5. The system of claim 1 wherein the one or more thermally insulated sections are double-walled tubing and the generator is located such that there is thermally insulated tubing both upstream and downstream of the generator.

6. The system of claim 1 wherein the generator is located within a thermally insulating section of wellbore tubing.

7. The system of claim 1 wherein the generator is based on the Seebeck effect.

8. The system of claim 1 wherein the generator comprises bismuth-telluride.

9. The system of claim 1 wherein the generator comprises microstructured bismuth-telluride and antimony telluride.

10. A method of providing electric power in a wellbore comprising tubing carrying hydrocarbon fluid, said wellbore defining a flow path for the fluid with an entry point for hydrocarbon fluid to flow into said wellbore from subterranean rock, said method comprising the steps of:
    providing at least one thermoelectric generator at a downhole location, to generate electricity from heat flowing between the fluid passing the generator and a region surrounding said location; and
    providing one or more thermally insulated sections of wellbore tubing, entirely located downhole, having a lower heat conductivity than another section of wellbore tubing extending downstream from said one or more thermally insulated sections, where said one or more sections of thermally insulated tubing provide an at least partially thermally insulated flow path upstream of the generator for fluid flowing through the wellbore from the entry point of said fluid to the location of the generator so that insulation of the flow path reduces heat loss of the fluid and thereby increases a temperature difference between the fluid passing the generator and the surrounding geothermal temperature.

11. The method of claim 10 wherein the wellbore tubing is production tubing and the generator is placed in the wellbore with the production tubing.

12. The method of claim 10 wherein the wellbore tubing is casing tubing and the generator is placed in the wellbore with the casing tubing.

13. The method of claim 10 wherein the one or more thermally insulated sections are double-walled tubing and the generator is located such that the tubing is thermally insulated both upstream and downstream of the generator.

14. The method of claim 10 comprising the step of placing the generator within a thermally insulating section of wellbore tubing.

15. The method of claim 10 wherein the length of wellbore containing said one or more thermally insulated sections of wellbore tubing is less than a length of a remainder of the wellbore.

16. The method of claim 10 wherein the wellbore contains production tubing defining a path for flow of said fluid, said production tubing is surrounded by an annular space within the wellbore, the thermoelectric generator is located on the production tubing to generate electricity from the temperature differential between the fluid in the production tubing and the annular space around the production tubing, and the at least partially thermally insulated flow path is created through the placement of one or more thermally insulated sections of production tubing having a lower heat conductivity coefficient than other sections of the production tubing.

17. The method of claim 10 wherein the one or more thermally insulated sections are characterized by having a heat conductivity coefficient which is lower by a factor of at least 100 than conventional wellbore tubing steel.

18. A method of providing electric power in a wellbore comprising tubing carrying hydrocarbon fluid, said wellbore defining a flow path for the fluid with an entry point for hydrocarbon fluid to flow into said wellbore from subterranean rock, said method comprising the steps of:
    providing at least one thermoelectric generator at a downhole location, said generator comprising bismuth-telluride to generate electricity from heat flowing between the fluid passing the generator and a region surrounding said location; and
    providing one or more thermally insulated sections of wellbore tubing, entirely located downhole, having a lower heat conductivity than another section of wellbore tubing extending downstream from said one or more thermally insulated sections, where said one or more sections of thermally insulated tubing provide an at least partially thermally insulated flow path upstream of the generator for fluid flowing through the wellbore from the entry point of said fluid to the location of the generator so that insulation of the flow path reduces heat loss of the fluid and thereby increases a temperature difference between the fluid passing the generator and the surrounding geothermal temperature.

19. The method of claim 18 wherein the thermally insulated flow path is formed by double-walled tubing.

20. The method of claim 18 comprising the step of placing the generator within a thermally insulating section of wellbore tubing so that the tubing is thermally insulated both upstream and downstream of the generator.

21. A method of providing electric power in a wellbore comprising tubing carrying hydrocarbon fluid, said wellbore defining a flow path for the fluid with an entry point for hydrocarbon fluid to flow into said wellbore from subterranean rock, said method comprising the steps of:

providing at least one thermoelectric generator at a downhole location, to generate electricity from heat flow between the fluid passing the generator and a region surrounding said location; and providing one or more sections of double-walled wellbore tubing, entirely located downhole, having a lower heat conductivity than another section of wellbore tubing extending downstream from said one or more double-walled sections, where a flow path for fluid flowing through the wellbore from the entry point of said fluid to the location of the generator is formed by double-walled tubing so that thermal insulation of the flow path by the double wall of the tubing reduces heat conductivity through the tubing and thereby reduces heat loss of the fluid and increases a temperature difference between the fluid passing the generator and the surrounding geothermal temperature.

22. The method of claim 21 comprising the step of placing the generator within a thermally insulating section of wellbore tubing so that the tubing is thermally insulated both upstream and downstream of the generator.

* * * * *